United States Patent [19]

Frohlich

[11] Patent Number: 4,986,870
[45] Date of Patent: Jan. 22, 1991

[54] APPARATUS FOR LAMINATING MULTILAYERED PRINTED CIRCUIT BOARDS HAVING BOTH RIGID AND FLEXIBLE PORTIONS

[75] Inventor: Sigurd Frohlich, Santa Barbara, Calif.
[73] Assignee: R.W.Q., Inc., Irvine, Calif.
[21] Appl. No.: 781,313
[22] Filed: Sep. 27, 1985

Related U.S. Application Data

[63] Continuation of Ser. No. 587,928, Mar. 9, 1984, abandoned.

[51] Int. Cl.⁵ .............................................. B32B 31/00
[52] U.S. Cl. .................................... 156/382; 156/580; 156/583.3
[58] Field of Search ......................... 156/87, 381–382, 156/384, 580–581, 583.3, 583.8, 285–286, 629–630, 288, 560–561

[56] References Cited

U.S. PATENT DOCUMENTS

| | | | |
|---|---|---|---|
| 2,267,721 | 12/1941 | Elmendorf | 156/87 |
| 3,433,699 | 3/1969 | Rumble | 156/285 |
| 3,493,451 | 2/1970 | Beery | 156/382 |
| 3,818,823 | 6/1974 | Bond | 156/583.3 |
| 3,852,136 | 12/1974 | Plumat et al. | 156/286 |
| 4,300,978 | 11/1981 | Whitemore | 156/87 |
| 4,421,589 | 12/1983 | Armini et al. | 156/583.8 |

Primary Examiner—Merrell C. Cashion, Jr.
Attorney, Agent, or Firm—Spensley Horn Jubas & Lubitz

[57] ABSTRACT

A method and apparatus for laminating multilayer printed circuit boards having both rigid and flexible portions. The multilayers of a multilayer printed circuit board are positioned on a lower lamination plate which rests on a bleeder plate which itself rests on a vacuum plate. The circuit layers are then covered with another steel plate, a sheet of silicon material, a breather blanket and a plastic vacuum bag which is hermetically sealed to the vacuum plate using a silicon sealing material. The vacuum plate and the components thereon are positioned within a pressure vessel, a vacuum line is connected to the vacuum plate and the multiple layers of the multilayer printed circuit board are laminated within the pressure vessel.

6 Claims, 4 Drawing Sheets

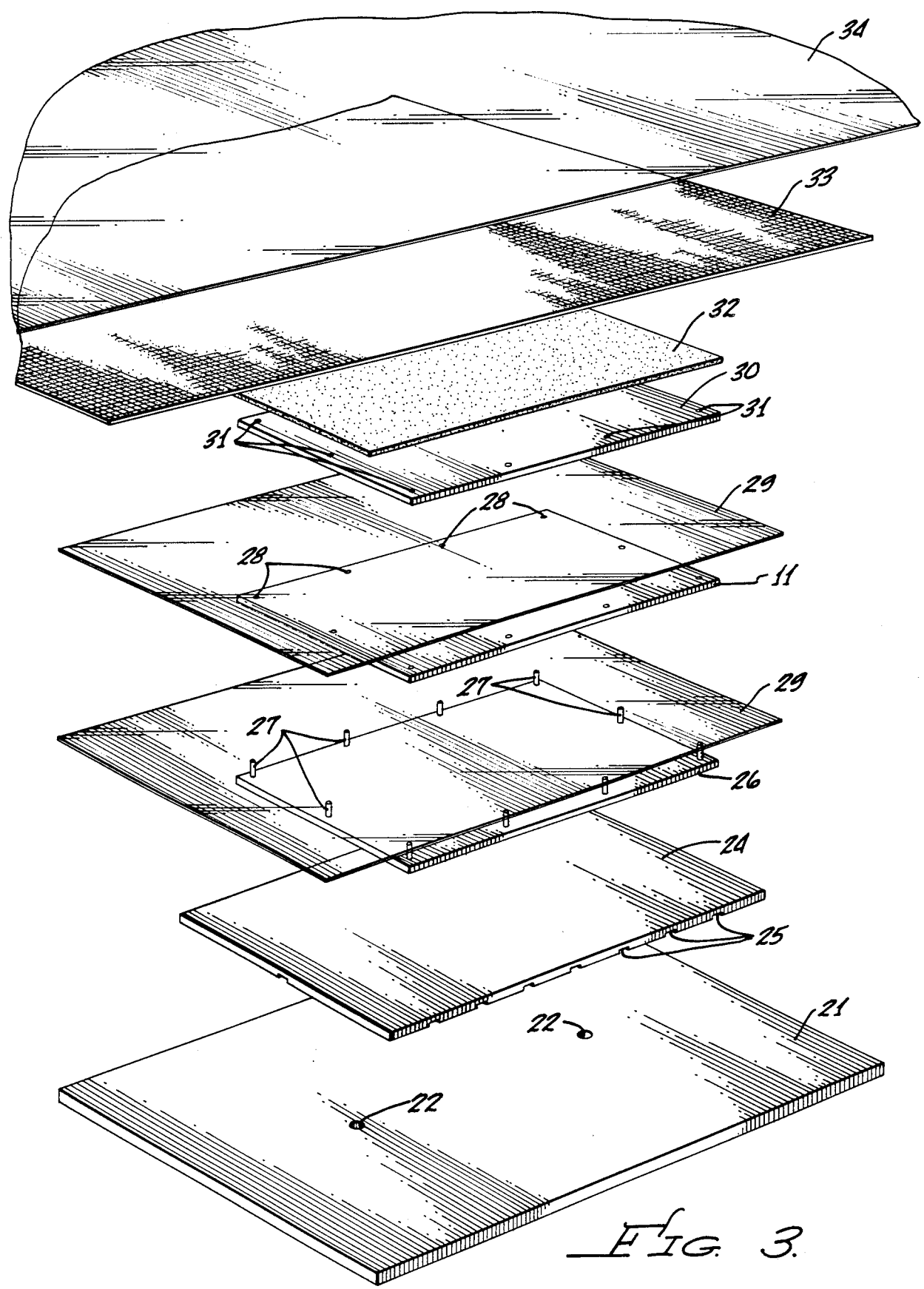

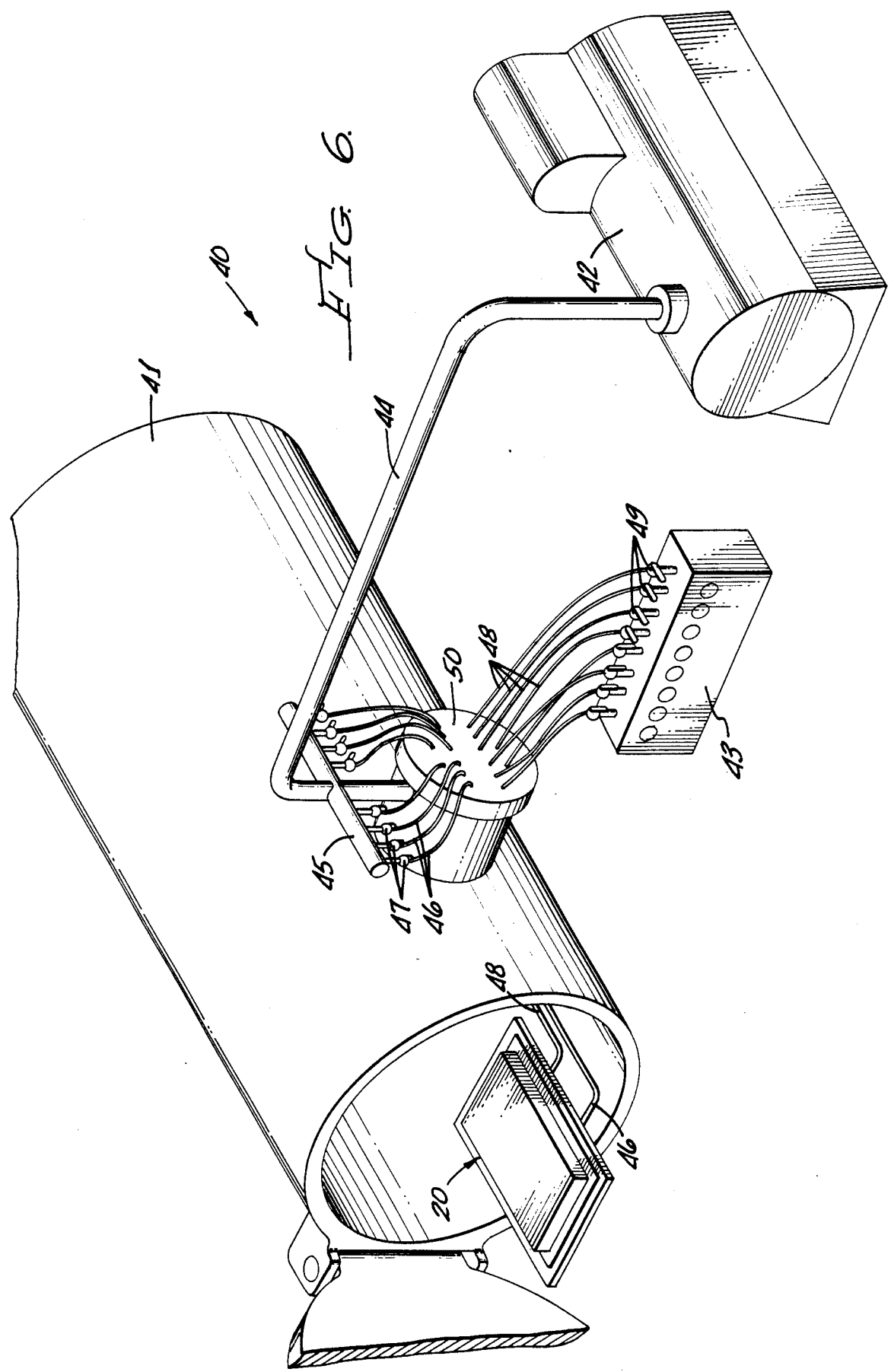

APPARATUS FOR LAMINATING MULTILAYERED PRINTED CIRCUIT BOARDS HAVING BOTH RIGID AND FLEXIBLE PORTIONS

This is a continuation of application Ser. No. 587,928, filed Mar. 9, 1984 (now abandoned).

BACKGROUND OF THE INVENTION

1. Field of the Invention

The present invention relates to a method and apparatus for laminating multilayer printed circuit boards having both rigid and flexible portions and, more particularly, to the use of a high pressure vessel into which a gas may be introduced and heated for laminating multilayer printed circuit boards with both rigid and flexible portions.

2. Description of the Prior Art

Multilayer printed circuit boards comprise a number of circuit layers separated by insulation layers which are laminated together to form a solid board. Each circuit layer consists of an insulation layer on which copper circuit traces appear on one or both sides thereof. The insulation layers are typically thin sheets of fiberglass or film dielectric and such insulating sheets are placed between the circuit layers.

In the past, such multilayer printed circuit boards have been laminated together by being placed between a pair of steel plates within a hydraulic press. The press is heated to a predetermined temperature and a pressure is applied for a predetermined time. At times, the multilayer assembly is placed within an air-tight, sealed chamber which is connected to a vacuum pump whereby air bubbles and gases produced during the heating of the materials may be removed.

As technology advances, this method has become unsatisfactory in many situations, for at least two reasons. In the past, multilayer printed circuit boards have either been rigid or flexible. In a rigid circuit board, each circuit layer consists of an insulation layer made from a rigid material. In a flexible circuit board, each circuit layer consists of an insulation layer made from a flexible sheet of material. Recently, a new requirement has developed for circuit boards that have both rigid portions and flexible portions. The lamination of such boards presents a number of difficult technical problems relating to thermal expansion and the even application of pressure during the lamination process. That is, the portions of the multilayer circuit board which are rigid have different coefficients of thermal expansion than the portions thereof which are flexible. Furthermore, the portions of the circuit board which are flexible are typically much thinner than the portions that are rigid so that elaborate inserts must be developed so that the press applies a uniform pressure to the entire circuit board during the lamination process.

The other problem relates to the spacing between the copper circuit traces on the individual circuit layers. That is, the circuit traces are becoming finer and more closely spaced and it is necessary that the insulation material flow uniformly into the spaces between all circuit traces during the lamination process. This is because the function of the insulating layer is not only to insulate the circuit traces on one layer of a mutlilayer board from the facing traces on an adjacent layer of the multilayer board, but also to insulate the individual traces on each multilayer board from each other. The steel plates of conventional hydraulic presses, being rigid, will not conform to the irregularities in the multiple layers and are simply not capable of applying a uniform pressure which will cause the insulation material to flow uniformly into all of the spaces between the circuit traces. Therefore, air becomes entrapped within the layers. This air creates spaces between circuit traces which are not filled with insulation material, resulting in possible shorts and rendering the multilayer printed circuit board subject to possible failure during future operation.

It is known in the prior art to use air pressure to laminate two parts together. The two parts to be laminated together are typically placed in a vacuum bag within a vessel into which air pressure is introduced. The air in the vessel is heated to a predetermined temperature and a pressure is applied for a predetermined time. However, while lamination of two parts using air pressure has been known, it has never been thought possible heretofore that such a technique could be used to perform the intricate lamination required when laminating a large number of complex layers of a multilayer printed circuit board.

SUMMARY OF THE INVENTION

According to the present invention, a pressure vessel is used for laminating together the multiple layers of a multilayer printed circuit board having both rigid portions and flexible portions. The pressure vessel has heating and cooling elements therein. The multilayer rigid/flexible circuits are placed on a steel plate which rests on a bleeder plate which itself rests on a vacuum plate. The circuit layers are then covered with another steel plate, a sheet of silicon material, a breather blanket and a plastic vacuum bag which is hermetically sealed to the plate using a silicon sealing material. A vacuum line is connected from the vacuum plate out of the vessel to a vacuum pump. The printed circuits in the enclosure are placed in the pressure vessel and the vessel is sealed. An inert gas such as nitrogen or $CO_2$ is introduced into the pressure vessel to achieve the desired pressure. Then the vessel is heated to a suitable lamination temperature. While the materials are being heated, any gases given off are removed by the vacuum pump.

After outgassing is completed and the temperature in the pressure vessel is raised to the required level, the induced high pressure is maintained for a predetermined period of time after which the heating element is deactivated and the cooling element is activated to cool down the multilayer circuit board while the pressure is maintained. At this time, the pressure is released and the gas expelled from the pressure vessel which may then be opened to remove the parts.

Following the teachings of the present invention, circuits of substantial length may be laminated without any exotic fixturing. Furthermore, multilayer circuit boards having both rigid and flexible portions may be laminated without the need for inserts or other means to attempt to compensate for differences in thermal expansion. The yields resulting from the present lamination process improve by an order of magnitude compared to mechanical processes previously employed for lamination. Following the teachings of the present invention, a uniform thickness of dielectric between circuit layers can be achieved, even with uneven geometries.

OBJECTS, FEATURES AND ADVANTAGES

It is therefore the object of the present invention to solve the problems associated with laminating multilayer printed circuit boards having both rigid and flexible portions and/or multilayer printed circuit boards having very fine geometries. It is a feature of the present invention to solve these problems by providing a gas pressure method and apparatus for laminating multilayer printed circuit boards. An advantage to be derived is that circuits of substantial length may be laminated without exotic fixturing. A further advantage is that multilayer circuit boards with both rigid and flexible portions may be laminated without the need for inserts or other means to attempt to compensate for differences in thermal expansion. A still further advantage is a lamination method and apparatus which permits significantly higher yields. Another advantage is a lamination process which permits the even application of pressure. Another advantage is the elimination of air pockets between the individual circuit layers of a multilayer printed circuit board.

Still other objects, features, and attendant advantages of the present invention will become apparent to those skilled in the art from a reading of the following detailed description of the preferred embodiment constructed in accordance therewith, taken in conjunction with the accompanying drawings wherein like numerals designate like or corresponding parts in the several figures and wherein:

BRIEF DESCRIPTION OF THE DRAWINGS

FIG. 3 is an exploded perspective view of the lamination module of FIG. 2;

FIG. 6 is a perspective view of a lamination apparatus for use with multiple lamination modules as shown in FIGS. 2 and 3.

DESCRIPTION OF THE PREFERRED EMBODIMENT

Figure 1:
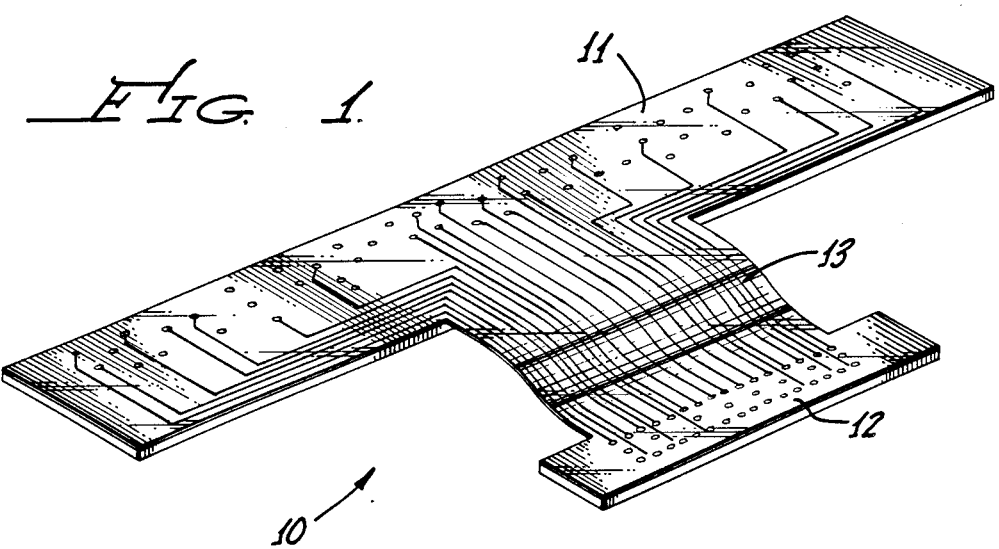
FIG. 1 is a perspective view of a multilayer printed circuit board having both rigid and flexible portions.

Referring first to FIG. 1, there is shown a multilayer printed circuit board, generally designated 10, including a main rigid portion 11 and a secondary rigid portion 12 interconnected by a flexible portion 13. Such a configuration is quite common in which rigid portion 11 comprises the main circuit board, rigid portion 12 comprises a series of terminals and flexible portion 13 permits the main circuit board portion 11 and the terminal portion 12 to be positioned in different planes and/or at different angles.

Figure 2:
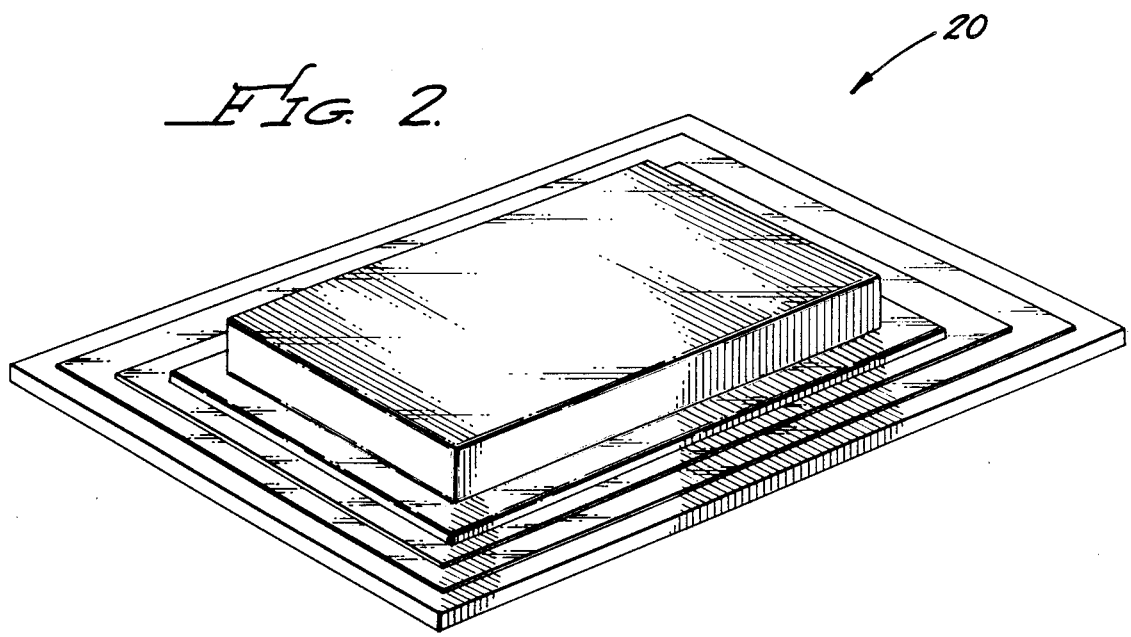
FIG. 2 is a perspective view of a completely assembled lamination module ready to be inserted into an autoclave for lamination.
Figure 5:
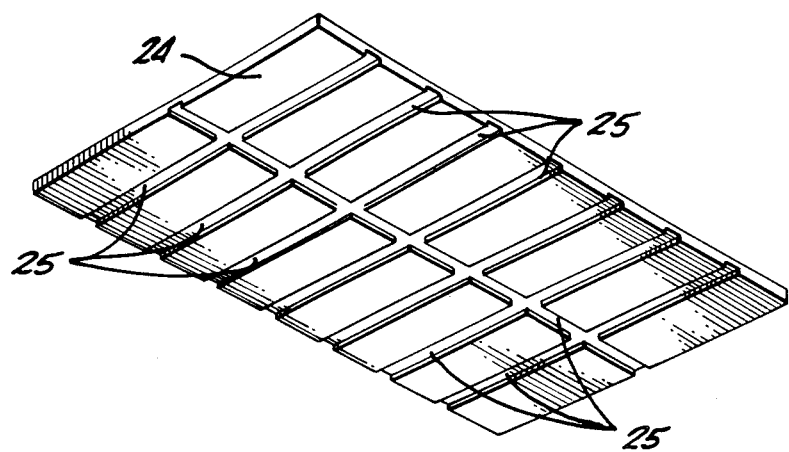
FIG. 5 is a perspective view of the bottom of the bleeder plate of the lamination module of FIG. 2.
Figure 4:
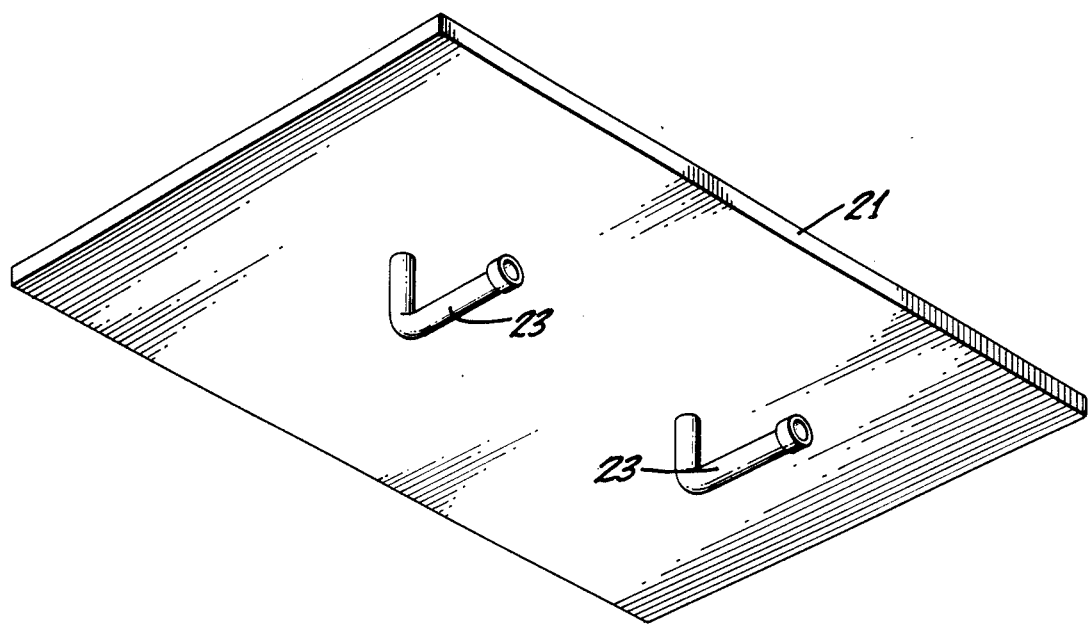
FIG. 4 is a perspective view of the bottom of the vacuum plate of the lamination module of FIG. 2.

According to the present invention, a pressure vessel 41 (an autoclave) is used for laminating together the multiple layers of multilayer printed circuit board 10. The apparatus for achieving this may be best understood with reference to FIGS. 2, 3, 4 and 5. More specifically, FIGS. 2 and 3 show a lamination module, generally designated 20, ready to be placed into a pressure vessel for laminating together the multiple layers of multilayer printed circuit board 10 positioned therein.

As discussed previously, printed circuit board 10 comprises a number of circuit layers separated by insulation layers which are to be laminated together to form a solid board. Each circuit layer consists of an insulation layer on which copper circuit traces appear on one or both sides thereof. The insulation layers are typically thin sheets of fiberglass or film dielectric and such insulating sheets are placed between the circuit layers. The present invention does not require any changes to conventional multilayer printed circuit boards of this type, the present invention being solely directed to the method and apparatus for achieving lamination.

Working from the lowermost layer to the uppermost layer, lamination module 20 includes a vacuum plate 21 which is simply a rigid (preferably steel) plate having a pair of vacuum ports 22 therein. A pair of vacuum line connectors 23 are secured to the bottom of plate 21, in registry with openings 22, to removably permit connection of vacuum lines to plate 21. As will be explained more fully hereinafter, one line is connectible to a vacuum pump for creating a vacuum within module 20 and the other is connected to measurement and control apparatus for monitoring such vacuum.

Resting on the top of vacuum plate 21 is a rigid bleeder plate 24 (preferably made from steel). The top surface of bleeder plate 24 is smooth whereas the bottom thereof has a series of crossed grooves 25 therein. Grooves 25 form a continuous channel from vacuum ports 22 to the perimeter of plate 24.

Resting on the top of bleeder plate 24 is a conventional lower lamination plate 26 (preferably made from steel) which has a plurality of locator pins 27 extending upwardly from the top thereof. Pins 27 mate with corresponding holes 28 in multilayer board 10. Before multilayer board 10 is placed on lamination plate 26, a sheet 29 of a suitable film is placed on the top of lamination plate 26 to facilitate the removal of board 10 from plate 26 after the lamination process has been completed. The use of such a sheet 29 is well known to those skilled in the art.

After printed circuit board 10 is placed on lamination plate 26, another sheet 29 is placed above board 10 before an upper lamination plate 30 is placed thereon. Upper lamination plate 30 has a plurality of holes 31 therein which receive the upper ends of pins 27. It should be mentioned that while plate 30 is not essential to the lamination process, it is preferably used so that holes 31 will receive the upper ends of pins 27 to prevent pins 27 from puncturing the vacuum bag.

Positioned immediately above upper lamination plate 30 is a sheet 32 of silicon rubber material. Above silicon rubber sheet 32 is positioned a breather blanket 33 which is made from a porous material. A preferred material is identified as an A-3000 resin bleeder and is manufactured by Richmond Division of Dixico Incorporated. A-3000 is a stretchable organic fiber with drapeability enabling it to conform closely to the contours of a part. It should be noted that breather blanket 33 extends beyond the ends of bleeder plate 24.

Finally, the entire assembly is covered by a plastic vacuum bag 34 which is hermetically sealed to the upper surface of vacuum plate 21 using a silicon sealing material.

Referring now also to FIG. 6, there is shown a lamination apparatus, generally designated 40, for performing vacuum lamination of printed circuit boards 10 within lamination module 20. Lamination apparatus 40 includes a conventional autoclave 41, a vacuum pump 42 and measurement and control apparatus 43. Vacuum pump 42 is connected via a main vacuum line 44 to a manifold 45 from which a plurality of vacuum lines 46 extend, each having its own individual valve 47. In the particular example, eight vacuum lines 46 are shown. In this manner, eight lamination modules 20 may be positioned within autoclave 41 for the simultaneous lamination of eight printed circuit boards 10. Extending from measurement and control apparatus 43 are a plurality of lines 48 each of which has its own valve 49. All of lines 46 and 48 extend through a wall 50 of autoclave 41 for connection to individual lamination modules 20.

With one or more lamination modules 20 assembled as previously described, a vacuum line 46 and a measurement and control line 48 is connected thereto via vacuum line connectors 23. While the individual lamination modules 20 are still outside of autoclave 41, vacuum pump 42 is activated to conduct a vacuum to modules 20. Grooves 25 in bleeder plate 24 provide channels for air to flow to vacuum ports 22. The multiple channels extending all the way around bleeder plate 24 insure a uniform path for air to flow from board 10 to vacuum port 42.

As the vacuum is drawn, vacuum bag 34 is drawn tightly around all components between it and vacuum plate 21. Sheet 32 prevents the sharp corners of upper lamination plate 30 from puncturing bag 34. In addition, breather blanket 33 totally covers all components between it and bleeder plate 24 and creates an air space below vacuum bag 34 so that vacuum bag 34 cannot be pulled tight against the sides of plates 24, 26 and 30. This, too, insures a uniform path for air flow to vacuum ports 22. Thus, with the construction of lamination module 20 just described, any air trapped within the circuit layers will be withdrawn by the vacuum and conducted to vacuum ports 22.

Lines 48 and measurement and control apparatus 43 function to monitor the vacuum and make sure that all is in order before the lamination process proceeds. If all apparatus is functioning properly, lamination modules 20 are placed within autoclave 41 and autoclave 41 is sealed. At this time, an inert gas, such as nitrogen or $CO_2$ is introduced into autoclave 41 to achieve a desired pressure. Then, autoclave 41 is heated by a suitable heater (not shown) to a suitable lamination temperature. While the materials are being heated, any gases given off within lamination module 20 are removed by vacuum pump 42.

After outgassing is completed and the temperature in autoclave 41 is raised to the required level, the induced high pressure is maintained for a predetermined period of time after which the heating element is deactivated and a suitable cooling element (not shown) is activated to cool down multilayer printed circuit board 10 while pressure is maintained. At this time the pressure is released and the gas expelled from autoclave 41 which may then be opened to remove the parts.

Following the teachings of the present invention, circuits of substantial length may be laminated without any exotic fixturing. Furthermore, multilayer circuit boards having both rigid and flexible portions may be laminated without the need for inserts or other means to attempt to compensate for differences in thermal expansion. The yields resulting from the present lamination process improve by an order of magnitude compared to mechanical processes previously employed for lamination. Following the teachings of the present invention, a uniform thickness of dielectric between the circuit layers can be achieved, even with uneven geometries.

While the invention has been described with respect to the preferred physical embodiment constructed in accordance therewith, it will be apparent to those skilled in the art that various modifications and improvements may be made without departing from the scope and spirit of the invention. Accordingly, it is to be understood that the invention is not to be limited by the specific illustrative embodiment, but only by the scope of the appended claims.

I claim:

1. A portable module for laminating multilayers of a multilayer printed circuit board comprising:
   a vacuum plate having a vacuum port and a vacuum line connector on one side thereof;
   bleeder plate means positioned on the other side of said vacuum plate for providing multiple channels for air flow to uniformly from said vacuum port to the perimeter of said means;
   a lower lamination plate positioned on said bleeder plate means, the multilayers of said printed circuit board being adapted to be positioned on said lower lamination plate;
   a blanket of porous material covering said printed circuit board, said lower lamination plate and said bleeder plate means; and
   a vacuum bag covering said blanket of porous material and hermetically sealed to said vacuum plate, said blanket and said vacuum bag conformable to the shape of the printed circuit board, the lower lamination plate and said bleeder plate means.

2. The module of claim 1 wherein the bleeder plate means comprises:
   a rigid plate having a smooth upper surface for receipt of said lower lamination plate and a series of intersecting grooves in the lower surface thereof which extends to the periphery thereof to provide channels for air to flow uniformly from said printed circuit board to said vacuum port.

3. The module of claim 1, further comprising:
   an upper lamination plate positioned on said multilayers of the printed circuit board; and
   a sheet of rubber-like material positioned above said upper lamination plate, said blanket of porous material covering said sheet of rubber-like material.

4. An apparatus for laminating multilayer printed circuit boards comprising:
   at least one portable lamination module, said module comprising:
   a. a vacuum plate having a vacuum port and a vacuum line connector on one side thereof;
   b. bleeder plate means positioned on the other side of said vacuum plate for providing multiple channels for air to flow uniformly from said vacuum port to the perimeter of said means;
   c. a lower lamination plate positioned on said bleeder plate means, the multilayers of said printed circuit board being adapted to be positioned on said lower lamination plate;
   d. a blanket of porous material covering said printed circuit board, said lower lamination plate and said bleeder plate means; and
   e. a vacuum bag covering said blanket of porous material and hermetically sealed to said vacuum plate, said blanket and said vacuum bag conformable to the shape of the printed circuit board, the lower lamination plate and said bleeder plate means; and a pressure vessel adapted for receiving each such portable lamination module, said pressure vessel comprising a plurality of vacuum lines, each of said vacuum lines being adapted for connection to a vacuum line connector of one of said lamination modules.

5. The apparatus of claim 4, wherein the bleeder plate means comprises:

a rigid plate having a smooth upper surface for receipt of said lower lamination plate and a series of intersecting grooves in the lower surface thereof which extends to the periphery thereof to provide channels for air to flow uniformly from said printed circuit board to said vacuum port.

6. The apparatus of claim 4, wherein the module further comprises:

f. an upper lamination plate positioned on said multi-layers of the printed circuit board; and g. a sheet of rubber-like material positioned above said upper lamination plate, said blanket of porous material covering said sheet of rubber-like material.

* * * * *